United States Patent
Hirano

(10) Patent No.: US 7,516,383 B2
(45) Date of Patent: Apr. 7, 2009

(54) METHOD AND APPARATUS FOR ANALYZING DELAY IN CIRCUIT, AND COMPUTER PRODUCT

(75) Inventor: Mitsuhiro Hirano, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 261 days.

(21) Appl. No.: 11/341,617

(22) Filed: Jan. 30, 2006

(65) Prior Publication Data

US 2007/0083804 A1    Apr. 12, 2007

(30) Foreign Application Priority Data

Oct. 11, 2005   (JP) .............. 2005-296534

(51) Int. Cl.
  *G01R 31/28*   (2006.01)
(52) U.S. Cl. .............. 714/741; 714/724; 714/47; 714/37; 714/735; 714/736; 703/13; 703/14; 703/15; 703/19; 703/22
(58) Field of Classification Search .............. None
  See application file for complete search history.

(56) References Cited

U.S. PATENT DOCUMENTS

| | | | |
|---|---|---|---|
| 5,400,270 A * | 3/1995 | Fukui et al. ................ | 703/19 |
| 5,920,830 A * | 7/1999 | Hatfield et al. ............. | 702/119 |
| 6,510,535 B1 * | 1/2003 | Hosokawa et al. .......... | 714/726 |
| 6,708,139 B2 * | 3/2004 | Rearick et al. .............. | 702/185 |
| 7,082,558 B2 * | 7/2006 | Gupte et al. ................ | 714/718 |
| 7,225,378 B2 * | 5/2007 | Ishida et al. ................ | 714/741 |
| 7,228,262 B2 * | 6/2007 | Anzou et al. ................ | 703/14 |
| 7,254,764 B2 * | 8/2007 | Ishida et al. ................ | 714/738 |
| 2002/0124218 A1 * | 9/2002 | Kishimoto ................... | 714/738 |
| 2003/0009716 A1 * | 1/2003 | Hosokawa et al. .......... | 714/729 |
| 2007/0011527 A1 * | 1/2007 | Goswami et al. ............ | 714/726 |

FOREIGN PATENT DOCUMENTS

| | | | |
|---|---|---|---|
| JP | 11-160400 | * | 6/1999 |
| JP | 2000-304820 | * | 11/2000 |
| JP | 2004-085333 | | 3/2004 |

* cited by examiner

*Primary Examiner*—John P Trimmings
(74) *Attorney, Agent, or Firm*—Arent Fox LLP.

(57) ABSTRACT

An extracting unit extracts unprocessed capturing destination in a circuit. A tracing unit traces an output branch point from a capturing destination and a determining unit determines an estimated failure site and a non-failure site in the circuit. A detecting unit narrows down an estimated failure site using a fail address. It is determined whether an identifying unit has identified a failure site. If the failure site has not been identified, a delay failure simulation is performed and a comparing unit compares the comparison result of the tester measurement and the result in the delay failure simulation to determine consistency between the results. The identifying unit identifies the failure site based on the consistency.

20 Claims, 15 Drawing Sheets

| CELL | FF 300 | CELL 301 | | CELL 302 | | CELL 305 | | | CELL 306 | | CELL 307 | | CELL 308 | | CELL 309 | |
|---|---|---|---|---|---|---|---|---|---|---|---|---|---|---|---|---|
| TERMINAL | D | A1 | A2 | A1 | A2 | A1 | A2 | A3 | A1 | A2 | A1 | A2 | A1 | A2 | A1 | A2 |
| FAIL ADDRESS 1 | ↓ | H FIXED | ↓ | H FIXED | ↓ | ↓ | ↓ | ↓ | ↓ | H FIXED | H FIXED | ↓ | H FIXED | H FIXED | ↓ | H FIXED |

※  IS SITE WHERE SIGNAL CHANGE IS FOUND

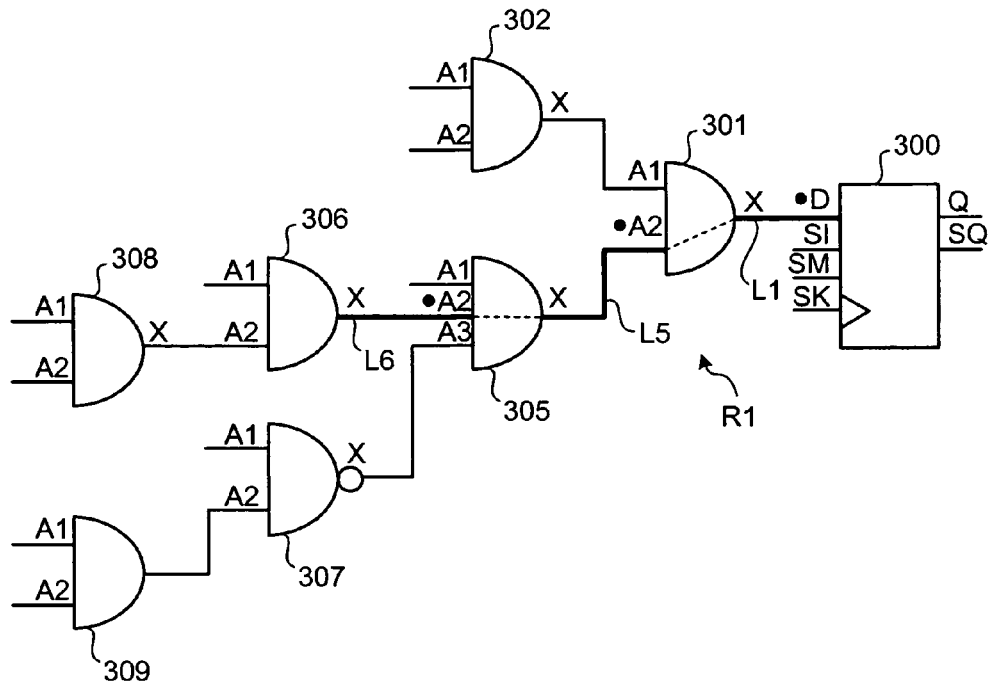

FIG.7B

| JUDGMENT PATTERN | COMPARISON RESULT | DELAY FAILURE SIMULATION RESULT | | |
|---|---|---|---|---|
| | | DATA INPUT TERMINAL D OF FF300: ↓ | INPUT TERMINAL A2 OF CELL 301: ↓ | INPUT TERMINAL A2 OF CELL 305: ↓ |
| A | FAIL | FAIL | FAIL | FAIL |
| B | PASS | FAIL | PASS | PASS |
| C | PASS | FAIL | FAIL | PASS |
| D | FAIL | FAIL | FAIL | FAIL |
| E | FAIL | FAIL | FAIL | FAIL |
| F | PASS | FAIL | FAIL | PASS |
| G | PASS | FAIL | PASS | PASS |
| H | FAIL | FAIL | FAIL | FAIL |
| I | PASS | FAIL | FAIL | PASS |
| J | FAIL | FAIL | PASS | FAIL |
| K | FAIL | FAIL | FAIL | FAIL |
| L | FAIL | FAIL | FAIL | FAIL |
| M | FAIL | FAIL | FAIL | FAIL |
| N | FAIL | FAIL | FAIL | FAIL |
| O | FAIL | FAIL | FAIL | FAIL |

FIG.7C

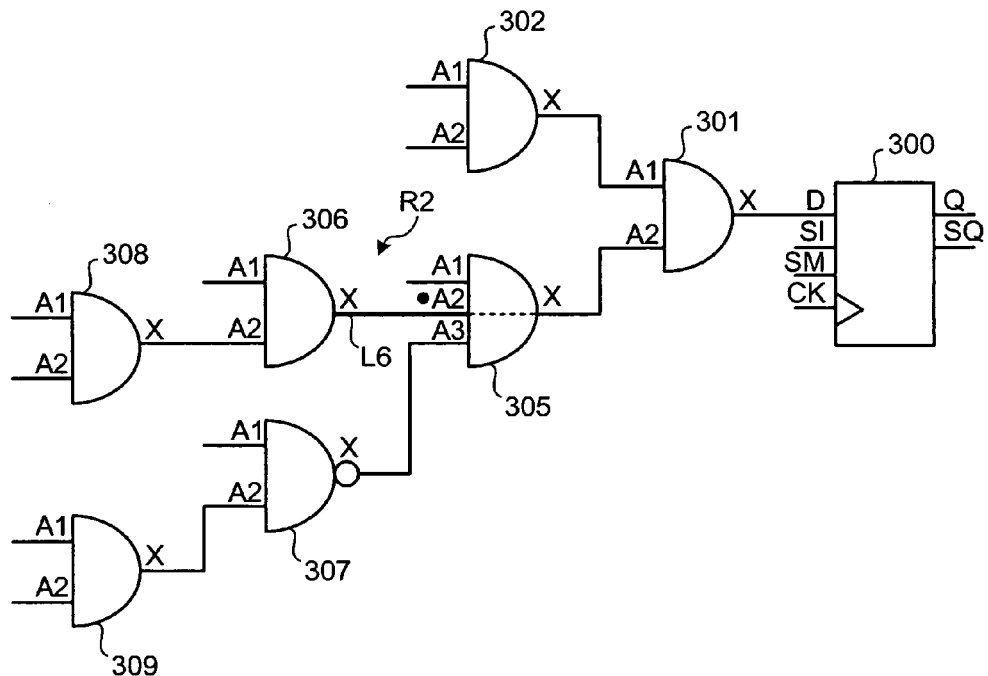

FIG.7D

| JUDGMENT PATTERN | COMPARISON RESULT | DELAY FAILURE SIMULATION RESULT | | |
|---|---|---|---|---|
| | | DATA INPUT TERMINAL D OF FF300: ↓ | INPUT TERMINAL A2 OF CELL 301: ↓ | INPUT TERMINAL A2 OF CELL 305: ↓ |
| A | FAIL | FAIL | FAIL | FAIL |
| B | PASS | FAIL | PASS | PASS |
| C | PASS | FAIL | FAIL | PASS |
| D | FAIL | PASS | FAIL | FAIL |
| E | FAIL | PASS | FAIL | FAIL |
| F | PASS | FAIL | FAIL | PASS |
| G | PASS | FAIL | PASS | FAIL |
| H | FAIL | FAIL | FAIL | FAIL |
| I | PASS | PASS | FAIL | FAIL |
| J | FAIL | PASS | PASS | FAIL |
| K | FAIL | FAIL | FAIL | FAIL |
| L | FAIL | FAIL | FAIL | FAIL |
| M | FAIL | PASS | PASS | PASS |
| N | FAIL | PASS | FAIL | FAIL |
| O | FAIL | FAIL | FAIL | FAIL |

METHOD AND APPARATUS FOR ANALYZING DELAY IN CIRCUIT, AND COMPUTER PRODUCT

CROSS-REFERENCE TO RELATED APPLICATIONS

This application is based upon and claims the benefit of priority from the prior Japanese Patent Application No. 2005-296534, filed on Oct. 11, 2005, the entire contents of which are incorporated herein by reference.

BACKGROUND OF THE INVENTION

1. Field of the Invention

The present invention relates to a technology for analyzing delay in a circuit.

2. Description of the Related Art

With recent development of high-speed-operation (higher-frequency-operation) semiconductor devices, accuracy in signal propagation time in a circuit has become very important. However, a delay serious enough to cause a defective operation can occur in a circuit, due to problems relating to the circuit itself, to manufacturing, or to deterioration. To solve problems in the circuit caused by such delay, it is necessary to take a countermeasure to a cause of the delay in a designing stage or a manufacturing stage.

For example, in a conventional analysis method, since a delay failure test is performed in a scan test on a scan-designed circuit, a flip-flop circuit taking in an error signal can be identified from a fail value. By repeating tracing and verification on an activated path between identified flip-flop circuit and a flip-flop circuit located at the preceding stage, investigation on a failure is performed (for example, Japanese Patent Application Laid-Open Publication No. 2004-85333).

In the above conventional method, it can be found that a delay failure path exists on the path between flip-flop circuits activated when data is set. However, depending on a scale of a combinational circuit in a section between the flip-flop circuits, a huge amount of analysis time is required. If the analysis is left to a user, a result of the analysis varies depending on experience and skill of the user. As a result, accuracy and credibility of the analysis are degraded.

SUMMARY OF THE INVENTION

It is an object of the present invention to at least solve the above problems in the conventional technology.

A delay analysis apparatus according to one aspect of the present invention includes an extracting unit configured to extract a predetermined destination from among destinations obtained by testing a circuit, the destinations being sites at which a delay signal is captured in the circuit; a tracing unit configured to trace an output branch point on a path that leads to the extracted destination, by tracing back from the destination; a determining unit configured to determine an estimated failure site in the circuit based on traced output branch point; and an output unit configured to output a result of determination by the determining unit.

A delay analysis method according to another aspect of the present invention includes extracting a predetermined destination from among destinations obtained by testing a circuit, the destinations being sites at which a delay signal is captured in the circuit; tracing an output branch point on a path that leads to extracted destination, by tracing back from the destination; determining an estimated failure site in the circuit based on traced output branch point; and outputting a result of determination.

A computer-readable recording medium according to still another aspect of the present invention stores a computer program for realizing the delay analysis method according to the above aspect.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 6 is a schematic for illustrating a fail address;

FIG. 7A is a schematic for illustrating a processing for identifying a failure site in a delay failure simulation;

FIG. 7B is a table of the delay failure simulation;

FIG. 7C is a schematic for illustrating the processing for identifying a failure site in the delay failure simulation;

FIG. 7D is a table of the delay failure simulation;

DETAILED DESCRIPTION OF THE PREFERRED EMBODIMENTS

Exemplary embodiments according to the present invention will explained in detail with reference to the accompanying drawings.

Figure 1:
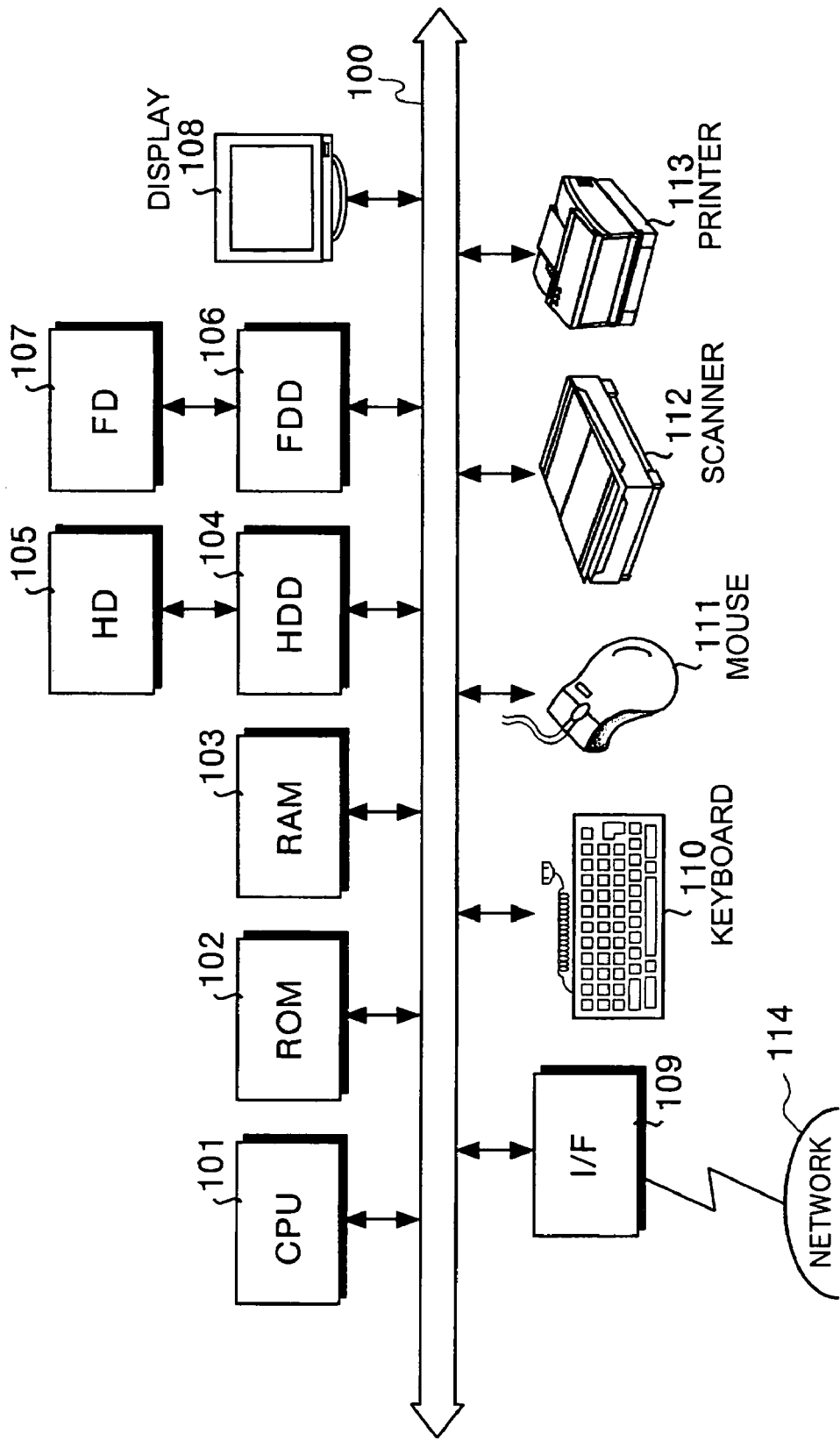
FIG. 1 is a schematic of a delay analysis apparatus according to an embodiment of the present invention.

FIG. 1 is a block diagram a delay analysis apparatus according to an embodiment of the present invention. As shown in FIG. 1, the delay analysis apparatus includes a central processing unit (CPU) 101, a read-only memory (ROM) 102, a random-access memory (RAM) 103, a had disk drive (HDD) 104, a had disk (HD) 105, a flexible disk drive (FDD) 106, a flexible disk (FD) 107 as an example of a removable recording medium, a display 108, an interface (I/F) 109, a keyboard 110, a mouse 111, a scanner 112, and a printer 113. Each component is connected via a bus 100.

The CPU 101 controls the whole of the delay analysis apparatus. The ROM 102 stores programs such as a boot program. The RAM 103 is used as a work area of the CPU 101. The HDD 104 controls read/write of data from/to the HD 105 in accordance with a control of the CPU 101. The HD 105 stores data written by the HDD 104.

The FDD 106 controls read/write of data from/to the FD 107 in accordance with a control of the CPU 101. The FD 107 stores data written by the FDD 106 and allows the delay analysis apparatus to read the data stored in the FD 107.

As a removable recording medium, besides the FD 107, a compact-disc read-only memory (CD-ROM), a compact-disc recordable (CD-R), a compact-disc rewritable (CD-RW), a magneto-optical disk (MO), a digital versatile disk (DVD), or a memory card may be used. The display 108 displays a cursor, icons, and tool boxes as well as data such as a document, an image, and function information. As the display 108, a cathode-ray tube (CRT), a thin-film-transistor (TFT) liquid-crystal display (LCD), and a plasma display may be used.

The I/F 109 is connected, via a communication line, to a network 114 such as the internet, and is connected to other apparatuses via the network 114. The I/F 109 functions as an interface between the network 114 and the apparatus, and controls input/output of data from/to an external apparatus. As the I/F 109, a modem, and a LAN adaptor may be used.

The keyboard 110 includes keys for inputting characters, numerals, and various instructions, and inputs various data to the apparatus. A touch-panel type input pad, and a numeric keypad may be also used instead. With the mouse 111, shift of a cursor, selection of an area, change of a position and a size of a window are performed. A trackball or a joystick may be used instead, as long as similar functions are provided as a pointing device.

The scanner 112 optically reads an image and captures image data into the delay analysis apparatus. The scanner 112 may have an optical character reader (OCR) function. The printer 113 prints image data and document data. As the printer 113, a laser printer or ink-jet printer may be used.

Figure 2:
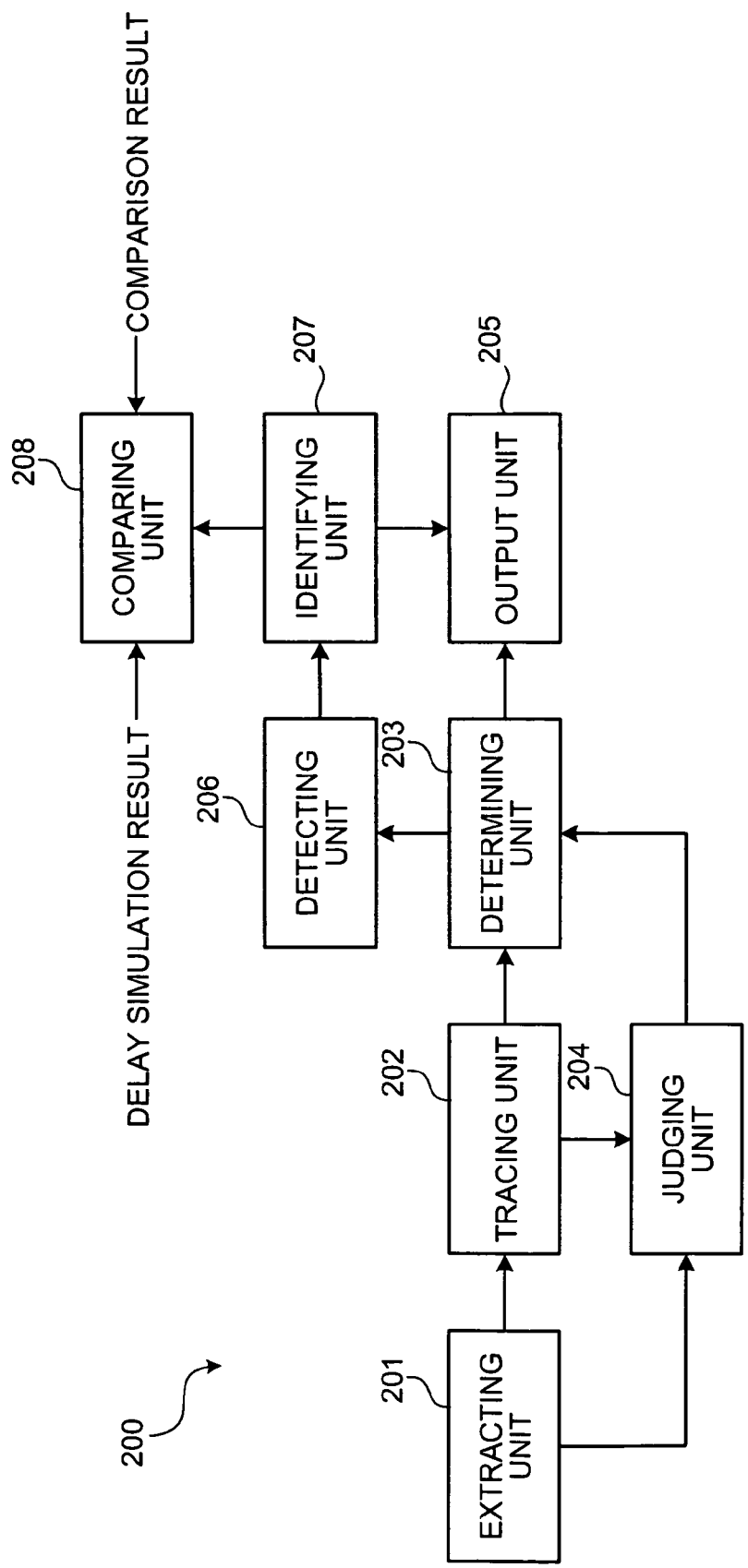
FIG. 2 is a block diagram of the delay analysis apparatus.

FIG. 2 is a block diagram of the delay analysis apparatus. As shown in FIG. 2, a delay analysis apparatus 200 includes an extracting unit 201, a tracing unit 202, a determining unit 203, a judging unit 204, an output unit 205, a detecting unit 206, an identifying unit 207 and a comparing unit 208.

The extracting unit 201 extracts a capturing destination of a delay signal obtained from a result of a test on a design target circuit. The test on a design target circuit may be a delay test using a scan test function (tester measurement), a scan test for other than a delay failure, or a function test. In the explanation below, a case of the delay test using a scan test function will be described.

The capturing destination is a site at which a delay signal (failure data) obtained from the tester measurement. In other words, the capturing destination is a cell in the design target circuit or an output terminal of the final stage of the design target circuit. The cell is, for example, a flip-flop circuit (hereinafter, "FF"). If the capturing destination is the FF, the FF is referred to as a fail capture FF. Similarly, if the capturing destination is the output terminal, the output terminal is referred to as a fail pin.

The tracing unit 202 traces an output branch point on a path to the capturing destination, from the capturing destination. Specifically, an output branch point is traced from a fail capture FF or a fail pin tracing back to a preceding stage.

The determining unit 203 determines an estimated failure site in the design target circuit, based on the output branch point traced by the tracing unit 202. The determination method is different when a single capturing destination is extracted and when more than one capturing destination is extracted.

When a single capturing destination is extracted, the estimated failure site is determined as a path from the output branch point to the capturing destination. The estimated failure site is a path including a failure site. A path before the output branch point is determined as a non-failure site. In this case, the tracing unit 202 does not perform tracing from an output branch source located on a stage before the output branch point. Thus, an unnecessary trace processing is not performed, thereby improving efficiency of the analysis.

On the other hand, when more than one capturing destination is extracted, the determining unit 203 determines paths from each of the capturing destinations to an output branch point as a non-failure site. The determination may be made using the judging unit 204 shown in FIG. 2. Specifically, the judging unit 204 judges whether an output branch point is linked to more than one capturing destination. The determining unit 203 determines an estimated failure site based on a result of judgment by the judging unit 204.

For example, when the judging unit 204 judges that the output branch point is linked to not all of extracted capturing destinations, the determining unit 203 determines the paths from the output branch point to capturing destinations that are linked to the output branch point as the non-failure sites. In other words, when at least one of the extracted capturing destinations is linked to a normal FF, not only a path to the normal FE, but also the paths to the capturing destinations (fail capture FF) are determined as the non-failure sites. Thus, an estimated failure site can be narrowed down.

In this case, a path before the output branch point is determined as a non-failure site. The tracing unit 202 does not perform tracing from an output branch source located on a stage before the output branch point. Thus, an unnecessary trace processing is not performed, thereby improving efficiency of the analysis.

On the other hand, when the judging unit 204 judges that the output branch point is linked to all of the plurality of the capturing destinations, the determining unit 203 determines a path between the output branch point and an output branch source of the output branch point as the estimated failure site. Thus, an estimated failure site can be narrowed down.

The output unit 205 outputs a result of determination by the determining unit 203. The result indicates the estimated failure site, the non-failure site, and a failure site described later. The result can be output by being displayed on the display 108 or by being printed out by the printer 113. The result can also be transmitted to an external computer apparatus via the I/F 109.

The detecting unit 206 detects a terminal having a signal transition based on a fail address before a capturing destination captures a delay signal. The fail address is information representing a signal transition at a terminal of a cell existing within the estimated failure site and represents a signal transition such as a change to H or L. In other words, the detecting unit 206 detects a terminal changed to H or L. On the other hand, a terminal of a cell fixed to H or L is not detected.

The detecting unit 206 may detect, based on plural fail addresses, a terminal having the same signal transition at all of the fail addresses. Since each of the fail addresses is obtained at different timing, signal transitions at a terminal of each cell vary. If a terminal has the same signal transitions at all fail addresses, it is determined that the terminal has a high possibility of failure.

The identifying unit 207 identifies a failure site from the estimated failure site based on a result of detection by the detecting unit 206. When a single terminal is detected, the identifying unit 207 can identify detected terminal as the failure site. On the other hand, if more than one terminal is detected, the failure site has not been narrowed down. Therefore, the failure site is identified by using the comparing unit 208.

The comparing unit 208 compares an expected output value of the capturing destination and an output value of the capturing destination obtained by actually testing the design target circuit. The comparing unit 208 further compares data obtained as a result of this comparison with data obtained in a delay failure simulation performed on the design target circuit. The delay failure simulation is performed by providing a pseudo delay signal to the estimated failure site. The identifying unit 207 identifies the failure site in the estimated failure site based on a result of comparison on the data.

Both data are error information based on an output value and on a pseudo delay respectively. For a simple delay failure on a line, an error can be almost completely reproduced in the delay failure simulation although dependency to a signal change is found. Therefore, if both data are identical in a terminal, the terminal can be identified as the failure site.

If complete reproduction is not possible for a failure, the failure is likely to be generated inside the cell. Therefore, the delay failure simulation is performed on the entire estimated failure site. When the data is not identical to each other, it is determined that the failure site is inside of the cell in the estimated failure site.

Functions of the extracting unit 201, the tracing unit 201, the determining unit 203, the judging unit 204, the output unit 205, the detecting unit 206, the identifying unit 207, and the comparing unit 208 are realized by the CPU 101 executing a program recorded on a recording medium, such as the ROM 102, the RAM 103, and the HD 105 or by the I/F 109.

Figure 3:
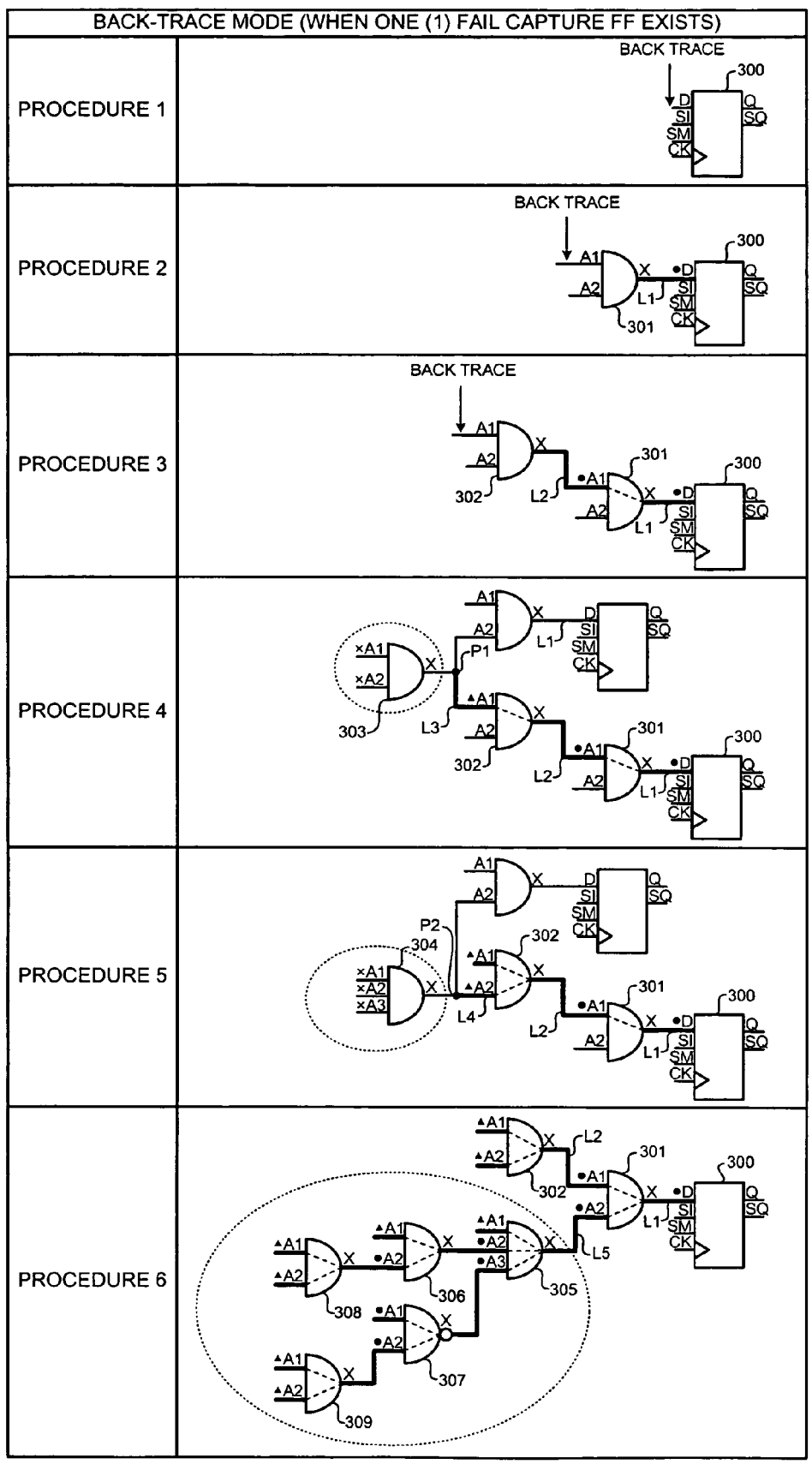
FIG. 3 is a schematic for illustrating a back-trace method.

FIG. 3 is a schematic for illustrating a back-trace method. A case in which only a single fail capture FE is included is shown in FIG. 3. Symbols of a black circle, a black triangle, and a cross to the left of input terminals, and a thick line shown in FIG. 3 represent the following meanings.

black circle: path having possibility of failure (between input and output terminals linking lines)

black triangle: path having possibility of failure (path from an output branch point to an input terminal)

cross: path having no possibility of failure thick line: path determined to have possibility of failure as a result of failure verification (estimated failure range)

In the example shown in FIG. 3, although a data signal is a target of the back trace from a fail capture FF, the possibility of failure with other input signals is not necessarily zero, and other input signals may be a target of the trace.

Procedure 1

A data input terminal D of a fail capture FF 300 is set as a start point for the back trace. The data input terminal D is a terminal capturing a delay signal in the tester measurement.

Procedure 2

While tracing back from the data input terminal D, an output branch point is traced in a stage before the data input terminal D. Since an output branch point does not exist on a line L1 that connects the data input terminal D and an output terminal X of a cell 301 in a stage before the fail capture FF 300, the back trace is further performed from an input terminal A1 of the cell 301.

Procedure 3

While tracing back from the input terminal A1, an output branch point is traced on a stage before the input terminal A1. Since an output branch point does not exist on a line L2 that connects the input terminal A1 and an output terminal X of a cell 302 in a stage before the cell 301, the back trace is further performed from an input terminal A1 of the cell 302.

Procedure 4

While tracing back from the input terminal A1, an output branch point is traced in a stage before the input terminal A1. Since an output branch point P1 exists on a line L3 that connects the input terminal A1 and an output terminal X of a cell 303 in a stage before the cell 302, it is determined that a failure source does not exist in a stage before the cell 303. Therefore, the back trace is not performed on the stage before the cell 303. The back trace is started from an input terminal A2 of the cell 302 that has not been processed.

Procedure 5

While tracing back from the input terminal A2, an output branch point is traced in a stage before the input terminal A2. Since an output branch point P2 exists on a line L4 that connects the input terminal A2 and an output terminal X of a cell 304 in a stage before the cell 302, it is determined that a failure source does not exist in a stage before the cell 304. Therefore, the back trace is not performed on the stage before the cell 304. The back trace is started from an input terminal A2 of the cell 301 that has not been processed.

Procedure 6

Procedures 2 to 5 are repeated for all input signal paths. The back trace is performed until all untraced input terminals are identified with a black triangle. When all terminals are processed, an estimated failure site that can be judged from a circuit configuration is determined. Paths determined to have possibility of failure in the back trace, which is indicated with the thick line, are the estimated failure site.

The back trace can be performed in a similar manner in a case in which more than one fail capture FF is included. If more than one fail capture FF is included, an output branch point that is common to all fail capture FFs is traced.

Figure 4A:
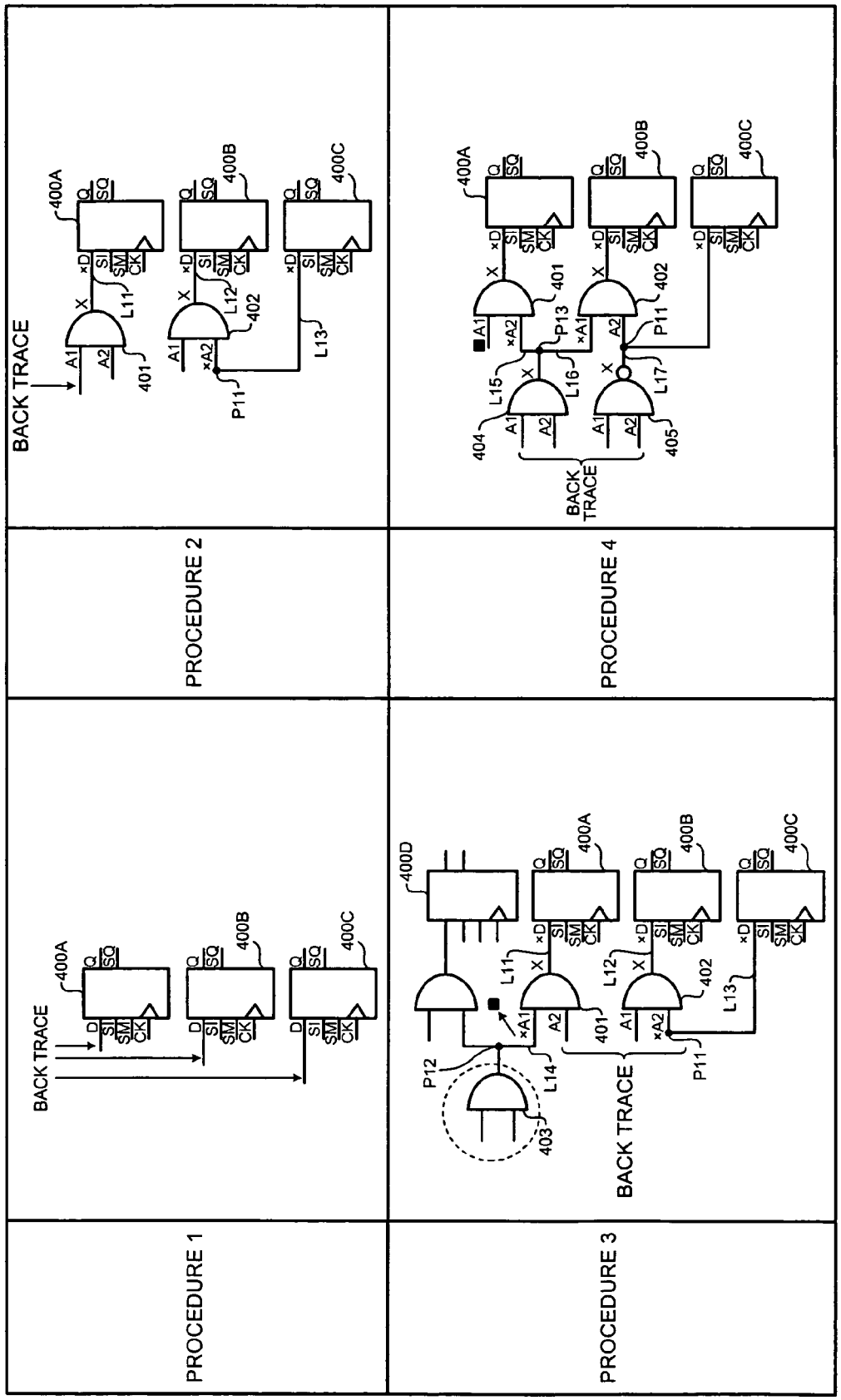
FIG. 4A is a schematic for illustrating the back-trace method when more than one fail-capture flip-flop circuit is included.
Figure 4B:
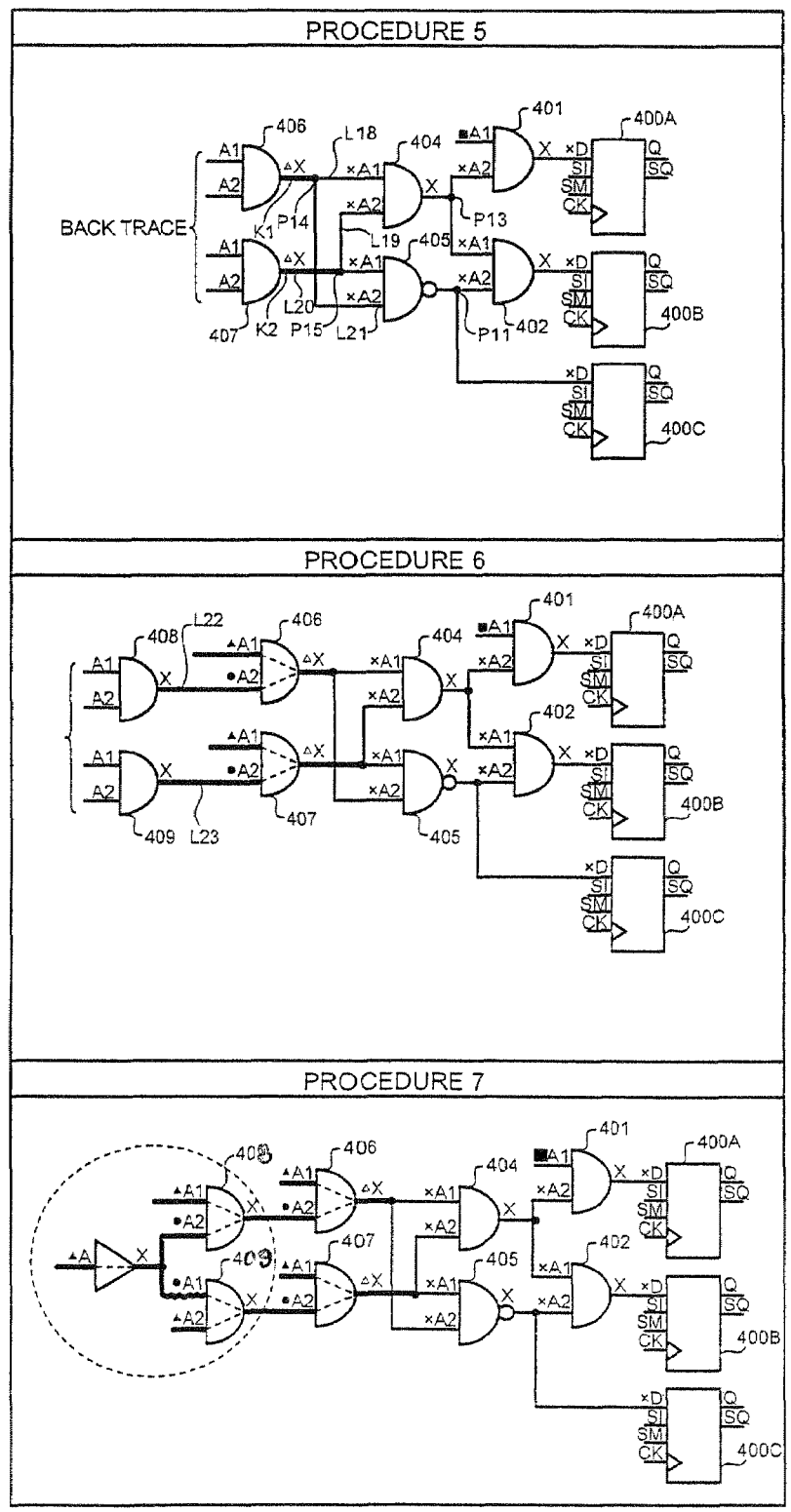
FIG. 4B is a schematic for illustrating the back-trace method when more than one fail-capture flip-flop circuit is included.

FIGS. 4A and 4B are schematics for illustrating the back-trace method when more than one fail capture FF is included. Symbols of the black circle, the black triangle, a white triangle, the cross, and a black rectangular to the left of input terminals, and the thick line shown in FIGS. 4A and 4B represent the following meanings.

black circle: path having possibility of failure (between input terminal and output terminal linking lines)

black triangle: path having possibility of failure (path from an output branch point to an input terminal)

white triangle: path having possibility of failure (path from an output terminal to an output branch point)

cross: path having no possibility of failure black rectangular: path having an input path destination having no possibility of failure thick line: path determined to have possibility of failure as a result of failure verification (estimated failure range)

In the example shown in FIGS. 4A and 4B, although a data signal is a target of the back trace from a fail capture FF, the possibility of failure with other input signals is not necessarily zero, and other input signals may be a target of the trace.

Procedure 1

Each data input terminal D of fail capture FFs 400A to 400C are set as a start point. Each data input terminal D is a terminal capturing a delay signal in the tester measurement.

Procedure 2

While tracing back from the data input terminal D of the fail capture FF 400A, an output branch point is traced in a stage before the data input terminal D of the fail capture FF 400A. Since an output branch point does not exist on a line L11 that connects the data input terminal D and an output terminal X of a cell 401 in a stage before the fail capture FF 400A, the line L11 is a path having an influence only on the fail capture FF 400A.

In other words, the line L11 is a path that dose not have an influence on a fail capture FF 400B and the fail capture FF 400C, and it is determined that the line L11 is a path having no possibility of failure. On the other hand, a stage before the cell 401 has not been determined as a site having no possibility of failure, the back trace is performed from an input terminal A1 of the cell 401.

Similarly, while tracing back from the data input terminal D of the fail capture FF 400B, an output branch point is traced in a stage before the data input terminal D of the fail capture FF 400B. Since an output branch point does not exist on a line L12 that connects the data input terminal D and an output terminal X of a cell 402 in a stage before the fail capture FF 400B, it is determined that the line L12 is a path having no possibility of failure. Therefore, the back trace is performed from the cell 402.

While tracing back from the data input terminal D of the fail capture FF 400C, an output branch point is traced in a stage before the data input terminal D of the fail capture FF 400C. An output branch point P11 is detected on a line L13 connected to the data input terminal D.

Although paths exist from the output branch point P11 to the fail capture FF 400B and the fail capture FF 400C, a path does not exist from the output branch point P11 to the fail capture FF 400A. Therefore, it is determined that the paths from the output branch point P11 to the fail capture FF 400B and the fail capture FF 400C have no possibility of failure. However, a stage before the output branch point P11 has not been determined as a site having no possibility of failure, the back trace is performed from the output branch point P 11, specifically, from an input terminal A2 of the cell 402.

Procedure 3

While tracing back from the input terminal A1 of the cell 401, an output branch point is traced in a stage before the input terminal A1 of the cell 401. Since an output branch point P12 exists on a line L14 that connects the input terminal A1 and an output terminal X of a cell 403 in a stage before the cell 401, it is determined that a failure source does not exist in the stage before the cell 403. Therefore, the back trace is not performed on the stage before the cell 403.

An FF 400D shown in FIG. 4A is a FF capturing a normal signal in the tester measurement. In other words, the FF400D is not a fail capture FE. Therefore, in this back trace, a status of the line L14 is changed from a path having no possibility of failure to a path having an input path destination having no possibility of failure (the symbol is changed from the cross to the black rectangular). Subsequently, the back trace is performed from an input terminal A2 of the cell 401 and an input terminal A1 and the input terminal A2 of the cell 402.

Procedure 4

While tracing back from the input terminal A2 of the cell 401 and the input terminal A1 and the input terminal A2 of the cell 402, an output branch point is traced in a stage before the cell 401 and the cell 402. An output branch point P13 is detected on a line L15 that connects the input terminal A2 of the cell 401 and an output terminal X of a cell 404 in a stage before the cell 401. Similarly, an output branch point P13 is detected on a line L16 that connects the input terminal A1 of the cell 402 and an output terminal X of the cell 404 in a stage before the cell 402.

Although paths exist from the output branch point P13 to the fail capture FF 400A and the fail capture FF 400B, a path does not exist from the output branch point P13 to the fail capture FF 400C. Therefore, it is determined that the paths from the output branch point P13 to the fail capture FF 400A and the fail capture FF 400B have no possibility of failure. However, a stage before the output branch point P13 has not been determined as a site having no possibility of failure, the back trace is performed from the cell 404.

While tracing back from the input terminal A2 of the cell 402, an output branch point is traced in a stage before the input terminal A2 of the cell 402. Since an output branch point does not exist on a line L17 that connects the input terminal A2 of the cell 402 and an output terminal X of a cell 405 in a stage before the cell 402, it is determined that the line L17 is a path having no possibility of failure. Therefore, the back trace is performed from an input terminal A1 and an input terminal A2 of the cell 405.

Procedure 5

While tracing back from the input terminal A1 and the input terminal A2 of the cell 404 and the input terminal A1 and the input terminal A2 of the cell 405, an output branch point is traced in a stage before the cell 404 and the cell 405. In this back trace, an output branch point P14 is detected on a line L18 that connects the input terminal A1 of the cell 404 and an output terminal X of a cell 406 as well as on a line L 21 that connects the input terminal A2 of the cell 405 and the output terminal X of the cell 406.

Since paths exist from the output branch point P14 to the fail capture FF 400A to 400C, it is determined that a path K1 (shown with a thick line in FIG. 4B) from the output branch point P14 on the line L18 and the line L21 to the output terminal X of the cell 406 has possibility of failure.

An output branch point P15 is detected on a line L19 that connects the input terminal A2 of the cell 404 and an output terminal X of a cell 407 as well as on a line L 20 that connects the input terminal A1 of the cell 405 and the output terminal X of the cell 406.

Since paths exist from the output branch point P15 to the fail capture FF 400A to 400C, it is determined that a path K2 (shown with a thick line in FIG. 4B) from the output branch point P15 on the line L19 and the line L20 to the output terminal X of the cell 407 has possibility of failure. Since a stage before the cell 406 and the cell 407 has not been determined as a site having no possibility of failure, the back trace is performed from the cell 406 and the cell 407.

Procedure 6

While tracing back from an input terminal A1 and an input terminal A2 of the cell 406 and an input terminal A1 and an input terminal A2 of the cell 407, an output branch point is traced in a stage before the cell 406 and the cell 407. If an output branch point (not shown) linked to the fail capture FF 400A to 400C is detected in a stage before the input terminal A1 of the cell 406 and in a stage before the input terminal A1 of the cell 407 in this back trace, a path in a stage before the output branch point (not shown) is excluded from a failure site.

On the other hand, since an output branch point does not exist on a line L22 that connects the input terminal A2 of the cell 406 and an output terminal X of a cell 408 in a stage before the cell 406, it is determined that the line L22 is a path having no possibility of failure. Similarly, since an output branch point does not exist on a line L23 that connects the input terminal A2 of the cell 407 and an output terminal X of a cell 409 in a stage before the cell 407, it is determined that the line L23 is a path having no possibility of failure. Therefore, the back trace is performed from the cell 408 and the cell 409.

Procedure 7

In a similar manner as procedure 6, while tracing back from the cell 408 and the cell 409, an output branch point is traced in a stage before the cell 408 and the cell 409. If an output branch point (not shown) linked to the fail capture FF 400A to 400C is detected, it is determined that a path from the output branch point (not shown) to an output terminal of a cell connected to the output branch point (not shown) has possibility of failure. Subsequently, the back trace is performed until the back trace is performed from all unprocessed input terminals.

Figure 5:
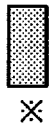
FIG. 5 is a schematic for illustrating a fail address.

FIG. 5 is a schematic for illustrating the fail address. A fail address 1 is a fail address of the design target circuit in procedure 6 shown in FIG. 3. In the example shown in FIG. 5, the estimated failure sites are narrowed down from 16 terminals to 9 terminals having signal transitions. Paths connecting these 9 terminals having signal transitions are the estimated failure sites. Since there are more than one terminal having signal transition, the failure site cannot be identified. To narrow down the estimated failure sites to identify the failure site, preferably, plural fail addresses are used.

Figure 6:
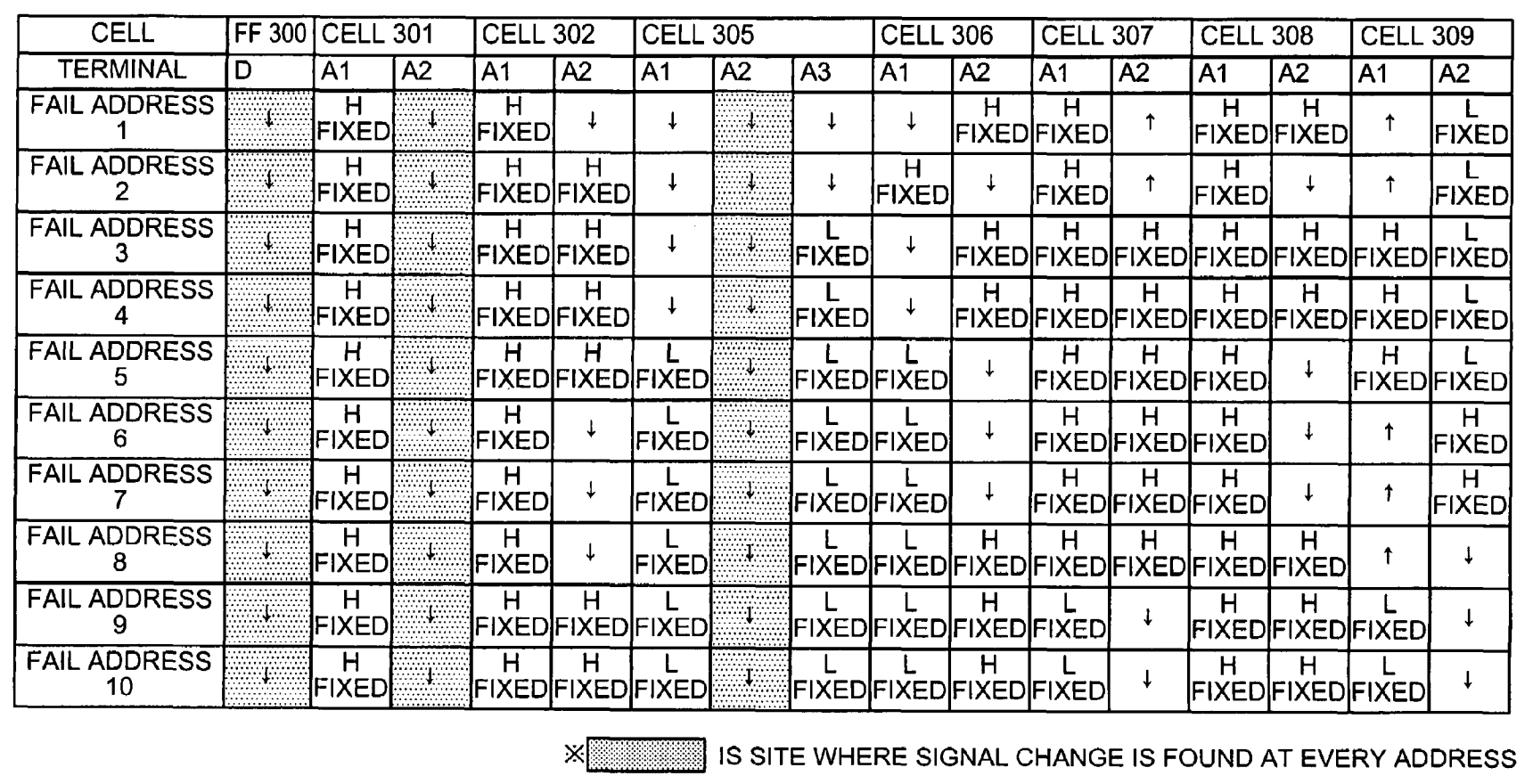

FIG. 6 is another schematic for illustrating the fail address. Fail addresses 1 to 10 are fail addresses of the design target circuit of procedure 6 shown in FIG. 3. Based on the fail addresses 1 to 10, a terminal having the same signal transition at all of the fail addresses 1 to 10 is detected from terminals of cells.

The data input terminal D of the fail capture FF 300 is a terminal having the same signal transition at all of the fail addresses 1 to 10. The input terminal A1 of the cell 301 is also a terminal having the same signal transition at all of the fail addresses 1 to 10. The input terminal A2 of the cell 305 is also a terminal having the same signal transition at all of the fail addresses 1 to 10. Therefore, 16 terminals are narrowed down to 3 terminals (the data input terminal D of the fail capture FF, the input terminal A2 of the cell 301 and the input terminal A2 of the cell 305).

Figure 7E:
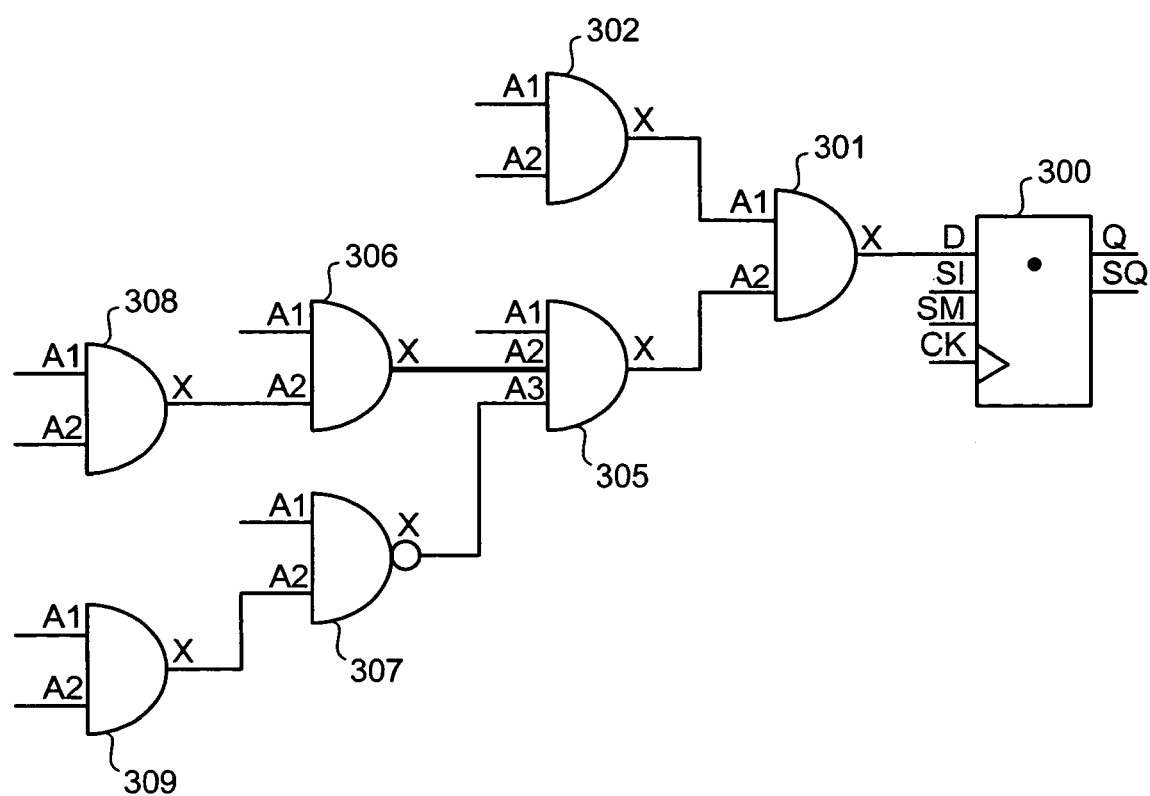
FIG. 7E is a schematic for illustrating the processing for identifying a failure site in the delay failure simulation.

FIGS. 7A to 7E are schematics for illustrating the processing for identifying a failure site using the delay failure simulation. FIG. 7A illustrates a stated in which the estimated failure sites (indicated with black circles in FIG. 7A) has been narrowed down by the fail address I shown in FIG. 5 after the back trace of procedure 6 shown in FIG. 3 is performed.

In the example shown in FIG. 7A, the estimated failure sites are narrowed down by the fail address shown in FIG. 6 to the data input terminal D of the fail capture FF 300, the input terminal A2 of the cell 301, and the input terminal A2 of the cell 305. Therefore, the estimated failure site is a path R1 from the fail capture FF 300 to the output terminal X of the cell 306 connected to the input terminal A2 of the cell 305 via a line L6. Within the path R1, lines L1, L5 and L6 are shown with thick lines in FIG. 7A.

FIG. 7B is a chart of a tester fail for each judgment pattern and a result of the delay failure simulation. Data captured by an FF are sequentially output from a scan-out terminal SO of the FF by shift resister operation of a scan chain. In a test pattern, an expected output value is set as a signal value output from the scan-out terminal SO at the time of normal operation. As a result of measurement of the design target circuit with the tester, if an output value from the design target circuit is identical to the expected output value, a comparison result is "PASS", and if not identical, a comparison result is "FAIL".

For example, when the design target circuit captures a judgment pattern A, since a signal value output from the scan-out terminal SO of the fail capture FF 300 is not identical to an expected output value, a comparison result is "FAIL". On the other hand, when the design target circuit captures a judgment pattern B, since a signal value output from the scan-out terminal SO of the fail capture FF 300 is identical to an expected output value, a comparison result is "PASS".

The judgment pattern A corresponds to the fail address 1 shown in FIG. 6; a judgment pattern D corresponds to the fail address 2 shown in FIG. 6; a judgment pattern E corresponds to the fail address 3 shown in FIG. 6; a judgment pattern H corresponds to the fail address 3 shown in FIG. 6; a judgment pattern I corresponds to the fail address 4 shown in FIG. 6; a judgment pattern J corresponds to the fail address 5 shown in FIG. 6; a judgment pattern K corresponds to the fail address 6 shown in FIG. 6; a judgment pattern L corresponds to the fail address 7 shown in FIG. 6; a judgment pattern M corresponds to the fail address 8 shown in FIG. 6; a judgment pattern N corresponds to the fail address 9 shown in FIG. 6; and a judgment pattern O corresponds to the fail address 10 shown in FIG. 6. In the chart show in FIG. 7B, a result of the delay failure simulation is also indicated. In other words, in the state shown in FIG. 7A, when the judgment patterns A to O are supplied as failure delay signals to the estimated failure sites, if the signal change of each terminal (the data input terminal D of the fail capture FF, the input terminal A2 of the cell 301 and the input terminal A2 of the cell 305) in the delay failure simulation is identical to the signal change occurred with the fail address, the result is "FAIL", and if not identical, the result is "PASS".

Therefore, a terminal for which the result for each of the judgment patterns A to O is completely identical to each of the result for each of the judgment patterns A to O in the comparison results, the terminal is identified as the failure site. In the example shown in FIG. 7B, since the delay failure simulation result of the input terminal A2 of the cell 305 is completely identical to the comparison result, the input terminal A2 of the cell 305 is included into the failure site, and the data input terminal D of the fail capture FF 300 and the input terminal A2 of the cell 301 are excluded from the failure site.

FIG. 7C illustrates a state in which the failure site has been identified. Since the input terminal A2 of the cell 305 is included into the failure site, the failure site is a path R2 (indicated with a black circle in FIG. 7C) formed with the output terminal X of the cell 306, the line L6, and the cell 305.

FIG. 7D is a chart of a comparison result of a tester fail and a result of the delay failure simulation. In the result of the delay failure simulation shown in FIG. 7D, any delay failure simulation result for each terminal (the data input terminal D of the fail capture FF, the input terminal A2 of the cell 301, and the input terminal A2 of the cell 305) at in the delay failure simulation is not completely identical to the comparison result. In such a case, since a site outputting an error including all the comparison results does not exist, it is determined that a failure site may exist in the inside of a cell for which an error cannot be reproduced in a simple delay failure simulation.

In a cell using a transmission gate, such as a latch circuit, a flip-flop circuit, and a selector circuit, an inside delay may not be simply reproduced because of a delay failure simulation model. Therefore, if such a cell exists in the estimated failure site, it is possible to judge that the failure is generated in the inside of the cell. For example, referring to FIG. 7D, since an error completely identical to the comparison results of the judgment patterns "A, D, E, H, J" does not exist in the delay failure simulation results, it is determined that the failure site exists in the fail capture FF 300, which is an only FF existing in the estimated failure site R1. FIG. 7E illustrates a state in which the failure site has been identified based on the chart shown in FIG. 7D.

As described above, when complete reproduction of a failure cannot be achieved by the delay failure simulation, the failure is likely to be generated inside a cell. Therefore, the delay failure simulation is performed for the entire estimated failure site, the failure site is identified based on following conditions (1) to (3) as the inside of a cell provided in the estimated failure site.

Specifically, the failure site can be narrowed down to the inside of a cell that cannot be delay-controlled from lines.

When an error cannot be reproduced in the delay failure simulation, the failure site of a line/cell can be differentiated.

(1) If the error information of the delay failure simulation includes all the error information of the tester and other errors, the failure site is identified as the inside of a cell using a multistage gate in a stage before the estimated failure site.

(2) If a part of the error information of the tester is reproduced in the delay failure simulation (a match rate is equal to or higher than a predetermined percentage but less than 100%), the failure site is identified as the inside of a cell using a multistage gate in a stage after the estimated failure site.

(3) If almost all or all of the error information of the tester cannot be reproduced in the delay failure simulation (match rate is less than the predetermined percentage), the failure site is identified as the inside of a cell using a transmission gate in the estimated failure site.

Regarding the delay failure generated inside the cell, if the delay failure simulation model is accurately designed, it is possible to completely reproduce the error in a delay addition simulation for each node (terminal). Therefore, the failure site can be pinpointed. With the comparing unit 208, the estimated failure site can be more accurately determined.

Figure 8:
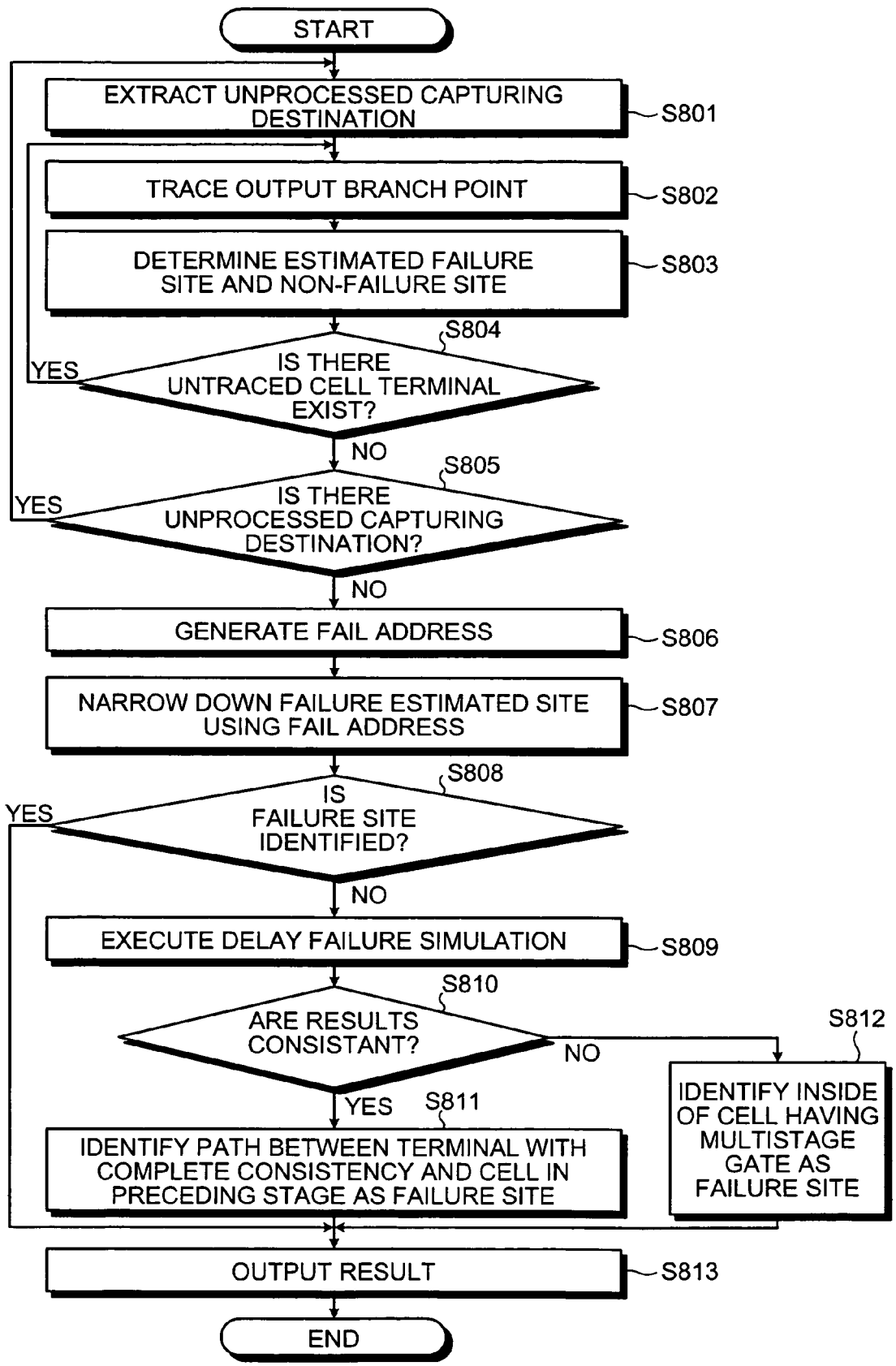
FIG. 8 is a flowchart of a delay analysis by the delay analysis apparatus.

FIG. 8 is a flowchart of a delay analysis processing by the delay analysis apparatus 200. As shown in FIG. 8, the extracting unit 201 extracts unprocessed capturing destinations (step S801). The number of the extracted capturing destinations may be set in advance by default or may be specified by a user each time.

The tracing unit 202 traces an output branch point from the capturing destinations (step S802) and the determining unit 203 determines the estimated failure site and non-failure site in a circuit(step S803). Specifically, if the extracting unit 201 extracts a single capturing destination, the processing by the tracing unit 202 and the determining unit 203 is executed based on the back-trace method shown in FIG. 3. On the other hand, if more than one capturing destination is extracted, the processing is executed based on the back-trace method shown in FIGS. 4A and 4B.

If there is a terminal that has not been processed ("YES" at step S804), the process returns back to step S802. On the other hand, if there is no terminal that has not been processed ("NO" at step S804), it is determined whether there is a capturing destination that has not been processed (step S805). If there is a capturing destination that has not been processed ("YES" at step S805), the process returns back to step S801. On the other hand, if there is no capturing destination that has not been processed ("NO" at step S805), the fail addresses shown in FIG. 5 or FIG. 6 are generated (step S806) and the estimated failure site is narrowed down by the detecting unit 206 using the fail addresses (step S807).

The identifying unit 207 determines whether the failure site is identified (step S808) based on the range of the estimated failure site narrowed down in step S807 or the number of terminals in the estimated failure site. If the failure site is identified ("YES" at step S808), the process proceeds to step S813. On the other hand, if the failure site is not identified ("NO" at step S808), by executing the delay failure simulation (step S809), the comparing unit 208 compares the comparison result of the tester measurement and the result in the delay failure simulation (step S810).

If there is a terminal at which both results are consistent ("YES" at step S810), the identifying unit 207 identifies a path between the terminal and a cell on a preceding stage as the failure site (step S811), and the process proceeds to step S813. On the other hand, if the data are not complete consistent with each other ("NO" at step S810), the identifying unit 207 identifies the inside of a cell having a multistage gate in the estimated failure site as the failure site (step S812), and the process proceeds to step S813. Then, the output unit 205 outputs info on the identified failure site (step S813). A series of process is completed.

While in the embodiment described above, a case in which the delay test using a scan test function has been explained, the present invention can be realized by a scan test other than the delay failure. In other words, in the scan test, the FF capturing a failure signal in the tester measurement is extracted to perform the back trace. Thus, the estimated failure site having possibility of failure due to circuit configuration of the design target circuit can be narrowed down.

Figure 9:
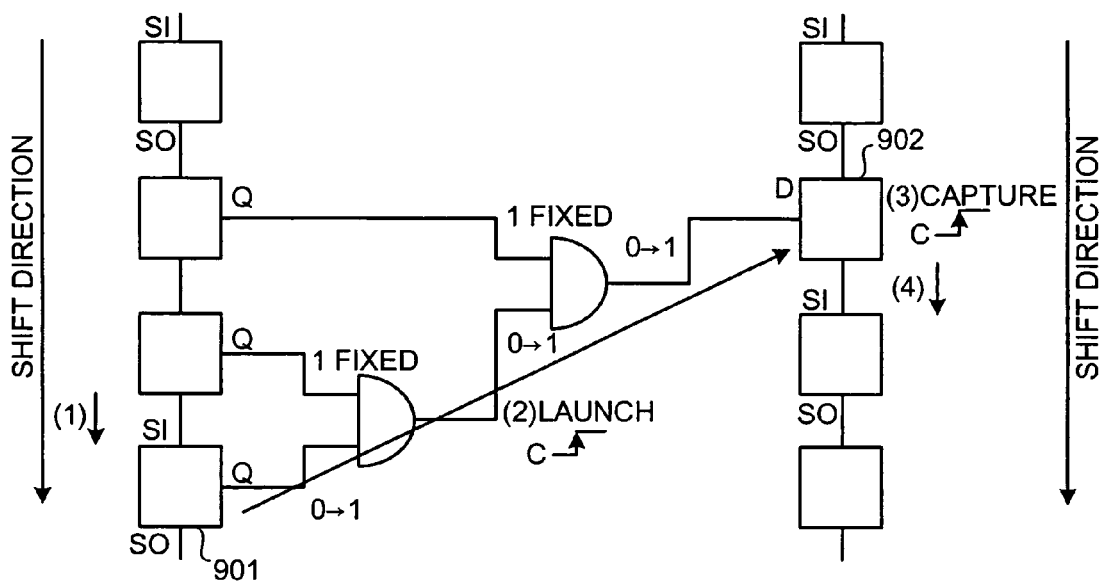
FIG. 9 is a schematic for illustrating a scan test in a skew-load mode.
Figure 10:
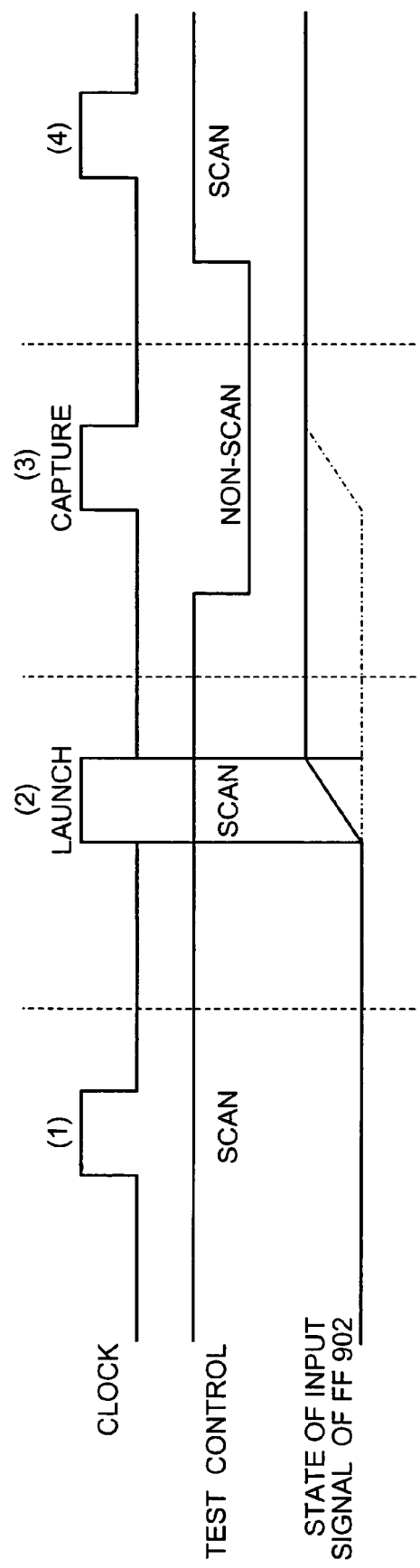
FIG. 10 is a timing chart for illustrating the scan test in the skew-load mode.

FIG. 9 is a schematic for illustrating a scan test in a skew-load mode and FIG. 10 is a timing chart for illustrating the scan test in the skew-load mode. When a scan test is performed for a delay between an FF 901 and an FF 902, the scan test is achieved between clocks (2) and (3) shown in FIG. 10.

In other words, at a clock (1), a scan-shifted signal is set to a scan input terminal S1 of the FF 901. At a clock (2), the signal from the scan input terminal S1 of the FF 901 is captured and the signal is sent from an output terminal Q to the FF 902. Thus, a signal combined between the FF 901 and the FF 902 is set to a data input terminal D of the FF 902. In this way, the launch operation is performed for the delay test.

At a clock (3), the signal from the data input terminal D of the FF 902 is captured, and the capture operation is performed for the delay test. In this example, if a delay does not exist between the FF 901 and the FF 902, "1" is captured, and if a delay exists, "0" is captured. At a clock (4) or later, the signal captured by the FF 902 is sequentially scan-shifted, and finally, an output value is determined using the signal as an output signal of a scan out terminal.

Therefore, as shown in FIG. 10, although the signal is input into the FF 902 at a clock (2) in a normal state, if a delay is generated between clocks (2) and (3), the signal is input into the FF 902 at a clock (3) (indicated with a dot-and-dashed line in FIG. 10).

Figure 11:
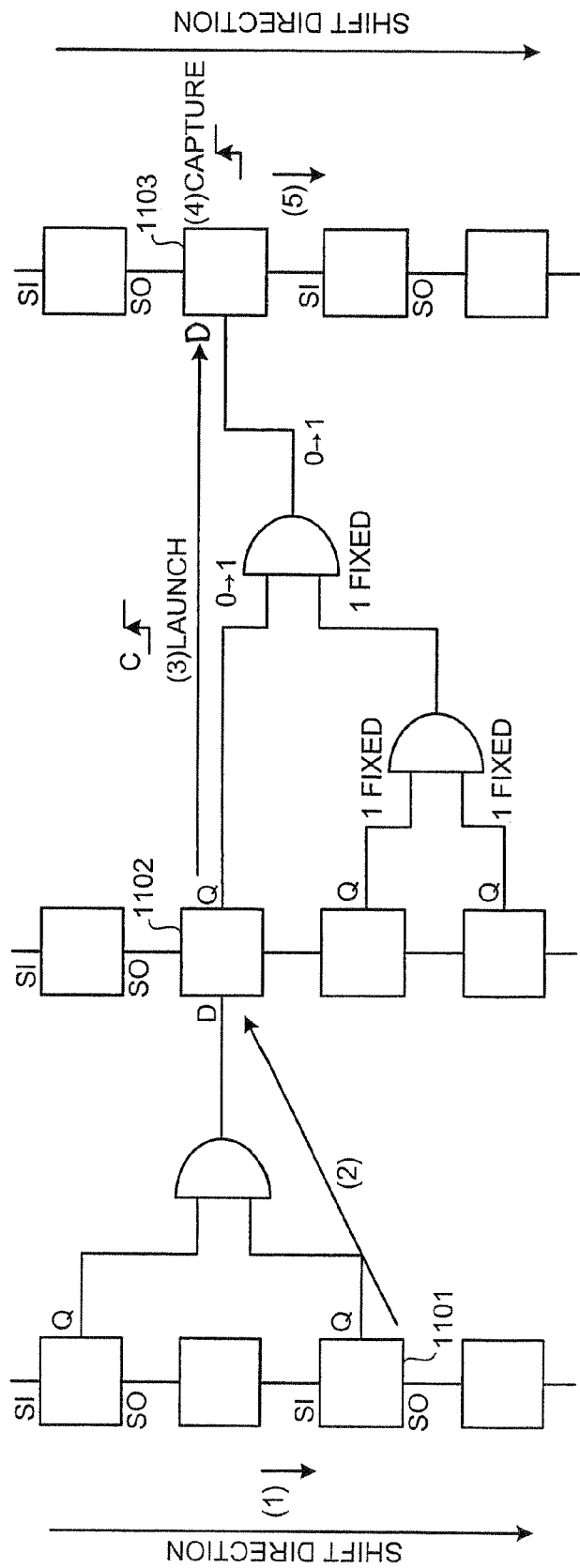
FIG. 11 is a schematic for illustrating a scan test in a broadside mode.
Figure 12:
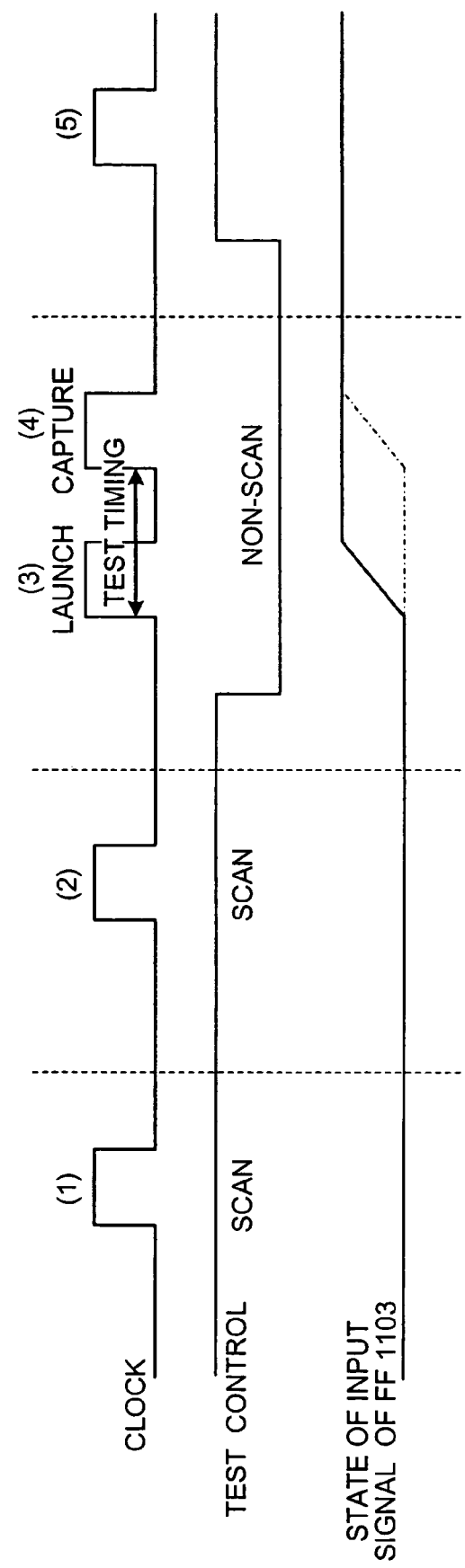
FIG. 12 is a timing chart for illustrating the scan test mode in the broadside mode.

A mode other than the skew load mode may also be applied. FIG. 11 is a schematic for illustrating a scan test in a broadside mode and FIG. 12 is a timing chart for illustrating the scan test mode in the broadside mode. Among an FF 1101, an FF 1102, and an FF 1103, when a scan test is performed for a delay between the FF 1102 and the FF 1103, the scan test is achieved between clocks (3) and (4) shown in FIG. 12.

In other words, at a clock (1) shown in FIG. 12, a scan-shifted signal is set to a scan input terminal S1 of the FF 1101. At a clock (2), the signal from the scan input terminal S1 of the FF 1101 is captured and the signal is sent from an output terminal Q to the FF 1102. Thus, a signal generated between the FF 1101 and the FF 1102 is set to a data input terminal D of the FF 1102.

At a clock (3), the signal from the data input terminal D of the FF 1102 is captured and the signal is sent from an output terminal Q to the FF 1103. Thus, a signal generated between the FF 1102 and the FF 1103 is set in a data input terminal D of the FF 1103. Thus, the launch operation is performed for the delay test.

At a clock (4) shown in FIG. 12, the signal from the data input terminal D of the FF 1103 is captured. Thus, the capture operation is performed for the delay test. In the example, if a delay does not exist between the FF 1102 and the FF 1103, "1" is captured, and if a delay exists, "0" is captured. At a clock (5) or later, the signal captured by the FE 1103 is sequentially scan-shifted, and finally, an output value is determined using the signal as an output signal of a scan out terminal.

Therefore, as shown in FIG. 12, although the signal is input into the FF 1103 at a clock (3) in a normal state, if a delay is generated between clocks (3) and (4), the signal is input into the FF 1103 at a clock (4) (indicated with a dot-and-dashed line in FIG. 12). Unlike the skew-load mode, a test can be performed without being limited by timing of a test control signal.

The failure analysis can be achieved by a test other than the scan test. For example, the failure analysis can be achieved by a function test. In a function test, an output terminal (fail pin) is extracted, which outputs a delay signal in the tester measurement. By performing the back trace from the fail pin as shown in FIG. 3, FIG. 4A and FIG. 4B, the estimated failure site can be narrowed down.

Since the fail capture FF is changed to the fail pin simply, the failure analysis can be realized in a similar manner as the case of the fail capture FF. In other words, since the failure analysis of the scan test is facilitated by clarifying limited circuits and fail addresses generating a failure, if the fail addresses can be found in the function test, the same delay analysis can be performed by using the fail addresses as shown in FIG. 5 or FIG. 6.

According to the embodiment of the present invention, the back trace can be realized only with circuit information by using a fail content, such as a fail address and a fail pin, at the time of defective operation of the design target circuit (LSI) as feedback information, and based on information on the presence of an output branch point of a cell, the presence of a path to a destination other than the fail capture FF, the number of the fail capture FF, the presence of a path to a destination other than the fail pins, and the number of the fail pins.

The back trace can be achieved while setting an input terminal of the fail capture FF or the fail pin as a start point. By repeating the trace until all destinations are traced, a path eventually remaining can be determined as the estimated failure site.

Since the delay failure is caused due to a change in a level of a signal passing through a circuit, a delay does not occur unless the signal changes. Therefore, the delay signal captured by the fail capture FE is generated by clock operation just before the clock for performing the capture operation, and the estimated failure site can be defined as a point at which the signal changes soon after the last clock operation.

Since the failure site is not completely identified in the estimated failure site, by executing the delay failure simulation supplying a pseudo delay signal to the estimated failure site, the failure site can be identified from the error content. Even when the pseudo delay signal for each signal change is supplied to all the estimated failure sites in the delay failure simulation, the comparison result of the tester can have little match with the delay failure simulation result.

Based on a fact that a simple delay failure can be reproduced in the delay failure simulation, in such a case, it is determined that the failure is likely to be generated in the inside of the cell, which cannot be controlled from external terminals, and the estimated failure site can be narrowed down by targeting a circuit (cell) using a transmission gate, which cannot be delay-controlled directly form the external terminals in the estimated failure site.

As described above, according to the delay analysis apparatus 200, delay analysis method, delay analysis program, and recording medium of the embodiment of the present invention, the estimated failure site is narrowed down with a circuit configuration and fail content. Therefore, the number of simulations required for the delay analysis can be minimized and the delay failure analysis time can be reduced.

Since the delay failure is a defect generated only when a signal change occurs, by focusing on the signal change soon after the clock operation inducing the generation of the delay, a potential failure circuit can be differentiated from a normal circuit. Therefore, the estimated failure site can be easily narrowed down. By using plural fail addresses, the accuracy of the failure estimation can be improved.

Moreover, since the delay analysis processing can be performed automatically, the failure analysis time can be further reduced without depending on a skill of a user. By executing the delay failure simulation supplying the pseudo delay signal, more accurate failure estimation can be achieved by comparing with the comparison result (tester fail) of the tester. Furthermore, by performing the delay failure simulation, it is possible to determine whether the failure is generated inside a cell or on a line.

According to the embodiments described above, it is possible to improve accuracy of an analysis and to reduce time required for the analysis.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A delay analysis apparatus comprising:
a CPU;
an extracting unit configured to extract a predetermined destination from among destinations obtained by testing a circuit, the destinations being sites at which a delay signal is captured in the circuit;
a tracing unit configured to trace an output branch point on a path that leads to the predetermined destination, by tracing back from the predetermined destination;
a determining unit configured to determine an estimated failure site in the circuit based on the traced output branch point; and
an output unit configured to output a result of determination by the determining unit.

2. The delay analysis apparatus according to claim 1, wherein the determining unit is configured to determine a path from the output branch point to the extracted destination as the estimated failure site.

3. The delay analysis apparatus according to claim 1, wherein the determining unit is configured to determine a path before the output branch point as a non-failure site.

4. The delay analysis apparatus according to claim 3, wherein the tracing unit is configured not to perform further tracing on a path from an output branch source positioned in a preceding stage to the output branch point in the non-failure site.

5. The delay analysis apparatus according to claim 1, wherein the determining unit is configured to determine, when a plurality of destinations are extracted by the extracting unit, a path from each of the destinations to an output branch point that appears on the path, as a non-failure site.

6. The delay analysis apparatus according to claim 1, further comprising
a judging unit configured to judge, when a plurality of destinations are extracted by the extracting unit, whether the output branch point is linked to the extracted destinations, wherein
the determining unit is configured to determine the estimated failure site based on a result of judgment by the judging unit.

7. The delay analysis apparatus according to claim 6, wherein the determining unit is configured to determine, when the judging unit judges that the output branch point is linked to not all of the extracted destinations, a path from the output branch point to a destination that is linked to the output branch point from among the extracted destinations as the non-failure site.

8. The delay analysis apparatus according to claim 6, wherein the determining unit is configured to determine, when the judging unit judges that the output branch point is linked to not all of the extracted destinations, a path in a preceding stage to the output branch point as the non-failure site.

9. The delay analysis apparatus according to claim 8, wherein the tracing unit is configured not to perform further tracing on a path from an output branch source positioned in a preceding stage to the output branch point.

10. The delay analysis apparatus according to claim 6, wherein the determining unit is configured to determine, when the judging unit judges that the output branch point is linked to all of the destinations, a path between the output branch point and an output branch source of the output branch point as the estimated failure site.

11. The delay analysis apparatus according to claim 1, further comprising:
a detecting unit configured to detect a terminal at which a signal transition has occurred, based on a fail address indicative of a signal transition occurring at a terminal of a cell in an estimated failure site before the delay signal is captured at a destination; and
an identifying unit configured to identify a failure site in the estimated failure site based on a result of detection by the detecting unit, wherein
the output unit outputs information on the failure site.

12. The delay analysis apparatus according to claim 11, comprising
a comparing unit configured to compare first data and a second data to check a consistency between the first data and the second data, the first data obtained as a result of comparison of an expected output value of the destination with an output value of the destination obtained by actually testing the circuit, the second data obtained in a delay failure simulation performed by providing a pseudo delay signal to the estimated failure site, wherein
the identifying unit is configured to identify the failure site in the estimated failure site based on the consistency.

13. The delay analysis apparatus according to claim 12, wherein the identifying unit is configured to identify a path of which the first data and the second data are consistent, as the failure site.

14. The delay analysis apparatus according to claim 12, wherein
the identifying unit is configured to identify an inside of a cell connected to a path of which the second data is partially identical to the first data as the failure site.

15. The delay analysis apparatus according to claims 1, further comprising:
a detecting unit configured to detect a terminal at which an identical signal transition occurs at all of a plurality of fail addresses, based on the fail addresses indicative of a signal transition occurring at a terminal of a cell in an estimated failure site before the delay signal is captured at a destination; and
an identifying unit configured to identify a failure site in the estimated failure site based on a result of detection by the detecting unit, wherein
the output unit outputs information on the failure site.

16. The delay analysis apparatus according to claim 15, comprising
a comparing unit configured to compare first data and a second data to check a consistency between the first data and the second data, the first data obtained as a result of comparison of an expected output value of the destination with an output value of the destination obtained by actually testing the circuit, the second data obtained in a delay failure simulation performed by providing a pseudo delay signal to the estimated failure site, wherein
the identifying unit is configured to identify the failure site in the estimated failure site based on the consistency.

17. The delay analysis apparatus according to claim 16, wherein the identifying unit is configured to identify a path of which the first data and the second data are consistent, as the failure site.

18. The delay analysis apparatus according to claim 16, wherein the identifying unit is configured to identify an inside of a cell connected to a path of which the second data is partially identical to the first data as the failure site.

19. A delay analysis method comprising:
extracting a predetermined destination from among destinations obtained by testing a circuit, the destinations being sites at which a delay signal is captured in the circuit;
tracing an output branch point on a path that leads to the predetermined destination, by tracing back from the predetermined destination;
determining an estimated failure site in the circuit based on the traced output branch point; and
outputting a result of the determining.

20. A computer-readable recording medium that stores therein a computer program for realizing a delay analysis method on a computer, the computer program making a computer execute:
extracting a predetermined destination from among destinations obtained by testing a circuit, the destinations being sites at which a delay signal is captured in the circuit;
tracing an output branch point on a path that leads to the predetermined destination, by tracing back from the predetermined destination;
determining an estimated failure site in the circuit based on the traced output branch point; and
outputting the determined estimated failure site.

* * * * *